US010495930B2

(12) United States Patent
Cao et al.

(10) Patent No.: US 10,495,930 B2
(45) Date of Patent: Dec. 3, 2019

(54) ARRAY SUBSTRATE, DISPLAY DEVICE AND MANUFACTURING METHOD OF THE ARRAY SUBSTRATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yu Cao, Beijing (CN); Haisheng Zhao, Beijing (CN); Zhilong Peng, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 14 days.

(21) Appl. No.: 15/306,458

(22) PCT Filed: Feb. 24, 2016

(86) PCT No.: PCT/CN2016/074446
§ 371 (c)(1),
(2) Date: Oct. 24, 2016

(87) PCT Pub. No.: WO2017/049865
PCT Pub. Date: Mar. 30, 2017

(65) Prior Publication Data
US 2017/0277004 A1 Sep. 28, 2017

(30) Foreign Application Priority Data

Sep. 21, 2015 (CN) .......................... 2015 1 0601927

(51) Int. Cl.
H01L 27/12 (2006.01)
G02F 1/1343 (2006.01)
(Continued)

(52) U.S. Cl.
CPC ...... *G02F 1/134309* (2013.01); *G02F 1/1368* (2013.01); *G02F 1/13439* (2013.01);
(Continued)

(58) Field of Classification Search
CPC ......... G02F 1/134309; G02F 1/136286; G02F 1/13439; G02F 1/1368; G02F 2201/123;
(Continued)

(56) References Cited

U.S. PATENT DOCUMENTS

2009/0225250 A1 9/2009 Lyu et al.
2012/0235174 A1 9/2012 Yu et al.
(Continued)

FOREIGN PATENT DOCUMENTS

CN 102998859 A 3/2013
CN 103605241 A 2/2014
(Continued)

OTHER PUBLICATIONS

International Search Report and Written Opinion in PCT/CN2016/074446 dated Jun. 2016, with English translation. 15 pages.
(Continued)

Primary Examiner — Selim U Ahmed
(74) Attorney, Agent, or Firm — Womble Bond Dickinson (US) LLP

(57) ABSTRACT

The present application provides an array electrode, which comprises: a plurality of gate lines, a plurality of data lines and a plurality of pixel units arranged in an array, wherein each pixel unit comprises a plate electrode, a slit electrode, and an insulating layer disposed between the plate electrode and the slit electrode. The slit electrode includes a plurality
(Continued)

of electrode strips, with slits being formed between adjacent electrode strips, and an electrode strip that at least partially overlaps a projection of the data line on the array substrate being disconnected from other electrode strips. The present application also proposes a display device comprising said array substrate and a method for manufacturing said array substrate.

15 Claims, 3 Drawing Sheets

(51) Int. Cl.
    *G02F 1/1362* (2006.01)
    *G02F 1/1368* (2006.01)

(52) U.S. Cl.
CPC ...... *G02F 1/136286* (2013.01); *H01L 27/124* (2013.01); *H01L 27/1244* (2013.01); *G02F 2001/134318* (2013.01); *G02F 2001/134372* (2013.01); *G02F 2001/136218* (2013.01); *G02F 2201/121* (2013.01); *G02F 2201/123* (2013.01)

(58) Field of Classification Search
CPC ............. G02F 2201/121; H01L 27/124; H01L 27/1214–1296; H01L 27/3244–3279; H01L 2021/775
See application file for complete search history.

(56) References Cited

U.S. PATENT DOCUMENTS

| | | | |
|---|---|---|---|
| 2014/0049741 A1* | 2/2014 | Dong | G02F 1/134309 349/143 |
| 2014/0168555 A1* | 6/2014 | Um | G02F 1/1343 349/43 |
| 2014/0375534 A1 | 12/2014 | Lee et al. | |
| 2017/0199441 A1 | 7/2017 | Um | |
| 2017/0277004 A1* | 9/2017 | Cao et al. | 257/72 |

FOREIGN PATENT DOCUMENTS

| | | | |
|---|---|---|---|
| CN | 103941488 | A | 7/2014 |
| CN | 104252068 | A | 12/2014 |
| CN | 104656324 | A | 5/2015 |
| CN | 105068340 | A | 11/2015 |
| CN | 204945582 | U | 1/2016 |
| KR | 20060128416 | | 12/2006 |
| KR | 20130026842 | | 3/2013 |

OTHER PUBLICATIONS

Office Action in Chinese Application No. 201510601927.5 dated Jul. 28, 2017, with English translation.
"First office action," KR Application No. 10-2017-7000878 (dated Mar. 16, 2018).
"Second office action," CN Application No. 201510601927.5 (dated Apr. 8, 2018).
Korean Office Action dated Sep. 28, 2018, Korean Application No. 10-2017-7000878 filed on Jan. 11, 2017.

* cited by examiner

ARRAY SUBSTRATE, DISPLAY DEVICE AND MANUFACTURING METHOD OF THE ARRAY SUBSTRATE

The present application is the U.S. national phase entry of PCT/CN2016/074446, with an international filing date of Feb. 24, 2016, which claims the benefit of Chinese Patent Application No. 201510601927.5, filed on Sep. 21, 2015, the entire disclosure of which is incorporated herein by reference.

TECHNICAL FIELD

The present application relates to the technical field of display, in particular to an array substrate, a display device and a manufacturing method of the array substrate.

BACKGROUND

Among flat panel display devices, the Thin Film Transistor Liquid Crystal Display (TFT-LCD) dominates in the current flat panel display market because it has small volume, low power consumption, relatively low manufacturing cost and no radiation.

Currently, the display modes of the TFT-LCD mainly includes: TN (Twisted Nematic) mode, VA (Vertical Alignment) mode, IPS (In-Plane-Switching) mode and AD-SDS (Advanced Super Dimension Switch) mode (ADS for short), etc.

In a display based on the ADS mode, a multi-dimensional electric field is formed by the electric fields generated by edges of slit electrodes in the same plane and the electric fields generated between the slit electrodes and plate electrodes, which causes rotation of oriented liquid crystal molecules between the slit electrodes and right above the electrodes within the liquid crystal cell, thereby increasing the working efficiency and light transmission efficiency of the liquid crystal. The ADS technology can improve image quality of a TFT-LCD product, and it has such advantages as high resolution, high transmission, low power consumption, wide viewing angle, high aperture ratio, low chromatic aberration and no push Mura.

An array substrate based on the ADS mode usually includes a plurality of pixel units arranged in an array, each pixel unit comprising a thin film transistor, a plate electrode and a slit electrode above the plate electrode, the slit electrode including a plurality of electrode strips with slits being formed between adjacent electrode strips.

In the prior art, forming an array substrate requires several times of filming and etching, and pattern defects might occur during the formation. When a pattern defect occurs in an insulating layer between a data line and a common electrode, it will cause short-circuit between said data line and the common electrode overlapping said data line, thereby reducing product yield rate.

SUMMARY

In order to solve the above problem, the present application proposes an array substrate, a display device and a manufacturing method of the array substrate, which can avoid short-circuit between the data line and the common electrode overlapping said data line caused by the occurrence of a defect in an insulating layer between the data line and the common electrode, thereby greatly increasing product yield rate.

According to one aspect of the present application, an array substrate is provided, which comprises a plurality of gate lines, a plurality of data lines and a plurality of pixel units arranged in an array, wherein each pixel unit comprises a plate electrode, a slit electrode, and an insulating layer disposed between the plate electrode and the slit electrode. The slit electrode includes a plurality of electrode strips, with slits being formed between adjacent electrode strips and an electrode strip that at least partially overlaps a projection of the data line on the array substrate being disconnected from other electrode strips.

According to the array substrate of the present application, even if a defect occurs in an insulating layer between a data line and a slit electrode (e.g. a common electrode), which causes short-circuit between said data line and one electrode strip of the slit electrode overlapping said data line, since the electrode strip at least partially overlapping the data line is disconnected from other electrode strips of the slit electrode, short-circuit between the data line and the entre slit electrode can be avoided, thereby greatly increasing product yield rate.

According to an embodiment, slits are formed at two ends of the electrode strip that at least partially overlaps the projection of the data line on the array substrate so as to disconnect said electrode strip from other electrode strips.

According to an embodiment, the electrode strip that at least partially overlaps the projection of the data line on the array substrate overlays said data line.

According to an embodiment, the plate electrode and the data line are arranged in the same layer.

According to an embodiment, the plate electrode is a pixel electrode and the slit electrode is a common electrode.

According to an embodiment, the electrode strip that at least partially overlaps the projection of the data line on the array substrate is disconnected from the common electrode.

According to an embodiment, the slit electrode is made of indium tin oxide.

According to an embodiment, the plate electrode is made of indium tin oxide.

According to another aspect of the present application, a display device is provided, which comprises an array substrate according to any one of the above embodiments.

According to still another aspect of the present application, a method of manufacturing an array substrate is provided, which comprises: forming a plate electrode and a data line on the array substrate; forming an insulating layer on the plate electrode; and forming a slit electrode on the insulating layer; wherein the slit electrode comprises a plurality of electrode strips, with slits being formed between adjacent electrode strips, and an electrode strip at least partially overlapping a projection of the data line on the array substrate being disconnected from other electrode strips.

According to an embodiment, slits are formed at two ends of the electrode strip that at least partially overlaps the projection of the data line on the array substrate so as to disconnect said electrode strip from other electrode strips.

The array substrate, display device and manufacturing method of the array substrate according to the present application can avoid short-circuit between the data line and the common electrode caused by the occurrence of a defect in the insulating layer between the data line and the common electrode, thereby greatly increasing product yield rate.

BRIEF DESCRIPTION OF THE DRAWINGS

By means of the detailed description below with reference to the drawings, the above and other aspects, the characteristics and advantages of the exemplary embodiments will become more clearly appreciated, wherein.

DETAILED DESCRIPTION

Figure 1:
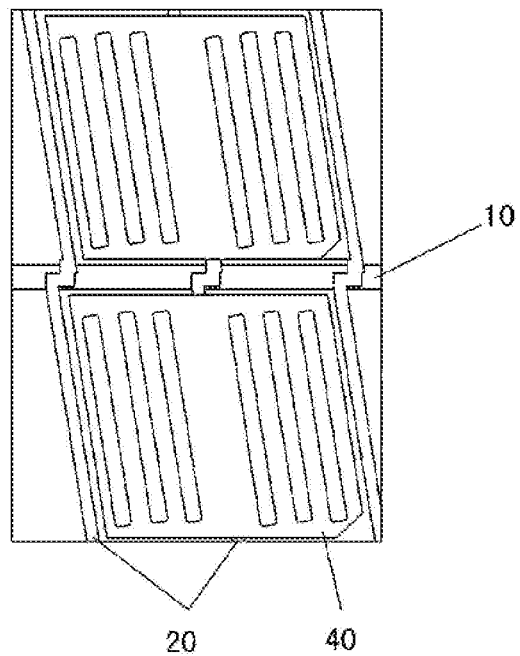
FIG. 1 is a schematic drawing of an array substrate of the prior art.

The exemplary embodiments of the present application will be now described in further detail with reference to the drawings which show some of the embodiments. But the present application can be implemented in many different forms, and it shall not be considered as being limited to the exemplary embodiments illustrated herein. These exemplary embodiments are only provided to make the disclosure of the application thorough and complete and to fully convey the inventive concept to those skilled in the art.

In the drawings, the sizes of layers and regions or the relative sizes thereof can be exaggerated for the sake of clarity.

To facilitate description, such terms as "under", "below", "down", "above" and "up" describing a relative spatial relationship can be used in this text to describe the relationship between one element or feature and another element or feature shown in the figures. It shall be understood that the relative spatial terms intend to cover other orientations of a device that is in use or in operation than the orientations shown in the figures. For example, if the device shown in the figure is inverted, then the element that has been described as "under other elements" or "below other elements" will accordingly be orientated as "above other elements or features". Thus the exemplary term "under/below" covers the two orientations of "above" and "under". A device can also be orientated in other ways (rotating 90 degrees or in other orientations), and the terms describing relative spatial relationship used in this text will be respectively explained.

In order to solve the problem of short-circuit between the data line and the common electrode overlapping said data line caused by the occurrence of a defect in an insulating layer between the data line and the common electrode, the present application proposes an array substrate, a display device and a manufacturing method of the array substrate, which can greatly increase product yield rate.

Figure 2:
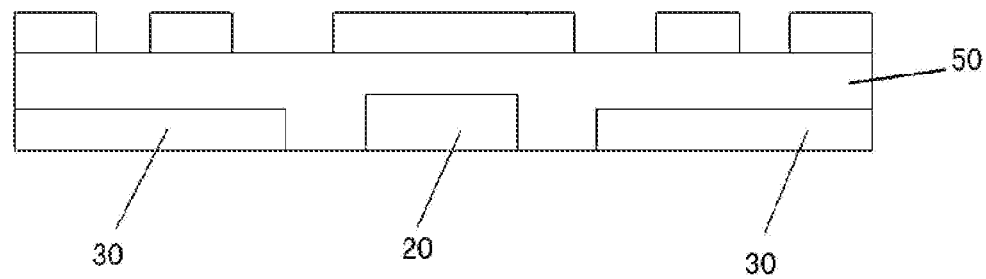
FIG. 2 is a schematic drawing of a sectional view of an array substrate of the prior art.

FIG. 1 is a schematic drawing of an array substrate of the prior art, and FIG. 2 is a schematic drawing of a sectional view of an array substrate of the prior art.

Referring to FIGS. 1 and 2, an array substrate comprises a plurality of gate lines 10, a plurality of data lines 20 and a plurality of pixel units arranged in an array. Each pixel unit comprises a plate electrode 30 and a slit electrode 40, with an insulating layer 50 disposed therebetween. The plate electrode 30 and the slit electrode 40 can be made of indium tin oxide (ITO). The insulating layer 50 can be made of silicon nitride.

Figure 3:
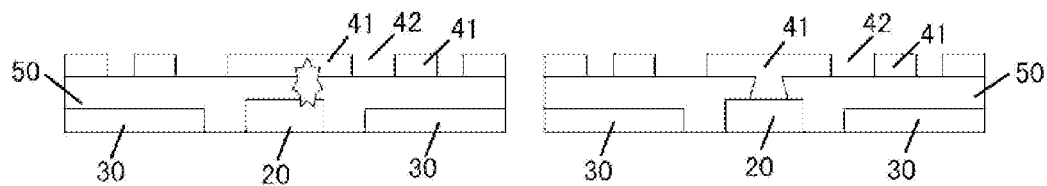
FIG. 3 is a schematic drawing of the possibility of occurrence of a defect in the insulating layer.

FIG. 3 is a schematic drawing of the possibility of occurrence of a defect in the insulating layer.

The left part of FIG. 3 shows that electrically conductive particles fall into the insulating layer between the slit electrode 40 and the data line 20, which will directly connect the data line and the slit electrode, causing short-circuit between the data line and the slit electrode. The right part of FIG. 3 shows that a cavity is formed at the insulating layer above the data line 20 before forming the slit electrode 40. After forming the slit electrode 40, since a cavity exists at the insulating layer therein, short-circuit is formed between the data line and the slit electrode overlaying on the data line. Forming an array substrate requires several times of filming and etching, so pattern defects as shown in FIG. 3 are likely to occur during the formation. When a pattern defect as shown in FIG. 3 occurs, it will cause short-circuit between the data line and the common electrode overlapping said data line, thereby reducing product yield rate.

Figure 4:
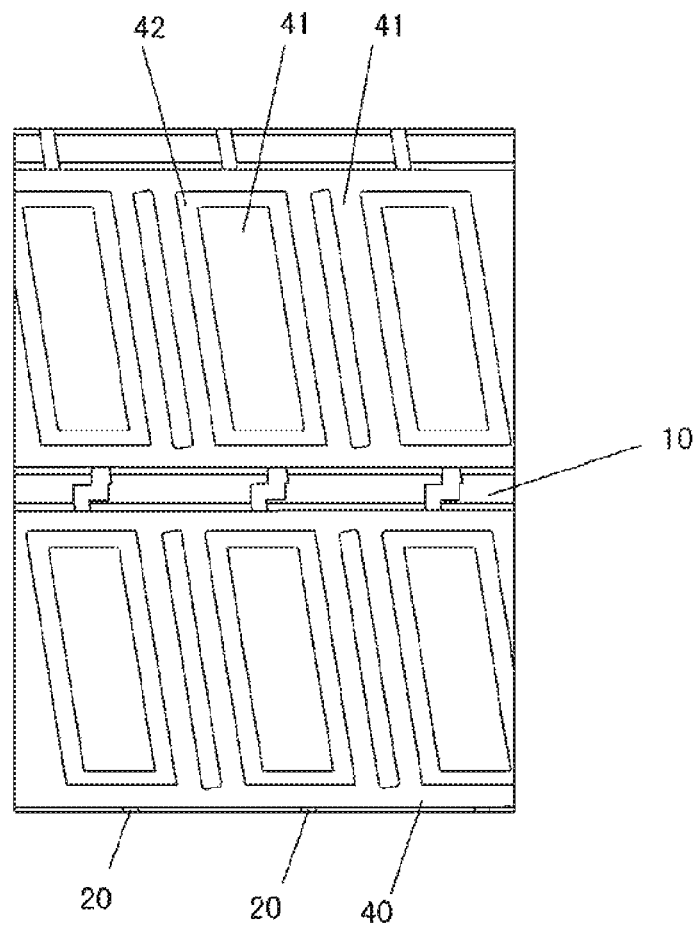
FIG. 4 is a schematic drawing of an array substrate according to an embodiment of the present application.

FIG. 4 is a schematic drawing of an array substrate according to an embodiment of the present application.

Referring to FIG. 4, the slit electrode 40 comprises a plurality of electrode strips 41, with slits 42 being formed between adjacent electrode strips, and an electrode strip at least partially overlapping a projection of the data line 20 on the array substrate being disconnected from other electrode strips.

As shown in FIG. 4, by forming slits at two ends of the electrode strip that at least partially overlaps the projection of the data line on the array substrate, said electrode strip can be disconnected from other electrode strips. Thus even if a defect occurs in an insulating layer between the data line and the slit electrode (e.g. common electrode), which causes short-circuit between said data line and one electrode strip of the slit electrode overlapping said data line, since the electrode strip at least partially overlapping the data line is disconnected from other electrode strips of the slit electrode, short-circuit between the data line and the entire slit electrode can be avoided, thereby greatly increasing product yield rate.

As shown in FIG. 4, the electrode strip 41 that at least partially overlaps the projection of the data line on the array substrate overlays the data line 20. By shielding the data line with the slit electrode strip disconnected from other slit electrode strips, short-circuit between the data line and the slit electrode caused by the occurrence of a defect in an insulating layer between the data line and the slit electrode can be avoided, meanwhile, irregular electric field, color crossing, light leakage and the like can be avoided.

The plate electrode 30 and the data line 20 can be arranged in the same layer.

The plate electrode 30 can be a pixel electrode and the slit electrode 40 can be a common electrode. Thus the electrode strip that at least partially overlaps the projection of the data line on the array substrate can be disconnected from the common electrode.

The slit electrode 40 and the plate electrode 30 can be made of indium tin oxide.

Figure 5:
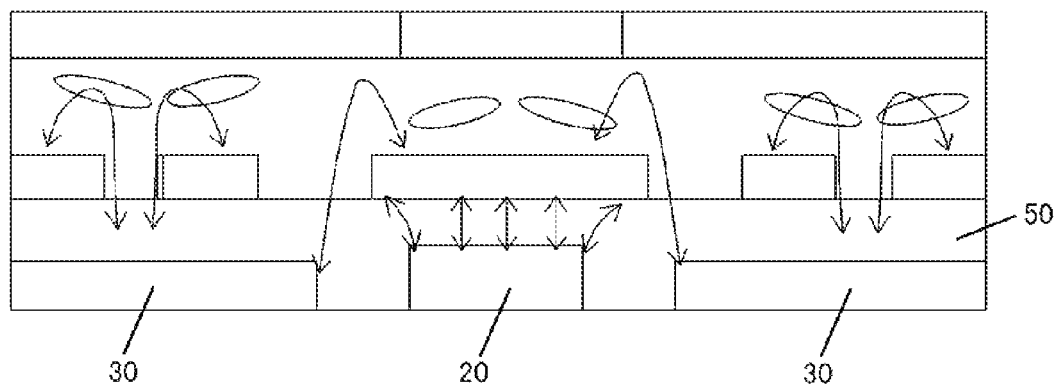
FIG. 5 is a schematic drawing of simulation of a fringe electric field of an array substrate according to an embodiment of the present application.

FIG. 5 is a schematic drawing of simulation of a fringe electric field of an array substrate according to an embodiment of the present application.

As shown in FIG. 5, the plate electrode 30 is a pixel electrode and the slit electrode 40 is a common electrode. The electric field in the region of each slit 42 is uniform, and liquid crystal molecules are uniformed distributed in said region. Light emitted by a backlight source is projected into a color film pixel through said region, thus obtaining the three primary colors of R, G and B.

In the array substrate according to the present application, while not destroying the structure of the slit electrode, the electrode strip above the data line 20 is disconnected from other electrode strips to form a strip-shape island. In this case, an island electrode strip above the data line can shield the irregular electric field between the data line and the pixel region to avoid problems like color crossing and light leakage; meanwhile, short-circuit between the data line and the common electrode caused by occurrence of a defect in the insulating layer between the data line and the island electrode strip can be avoided, thereby greatly increasing product yield rate.

Figure 6:
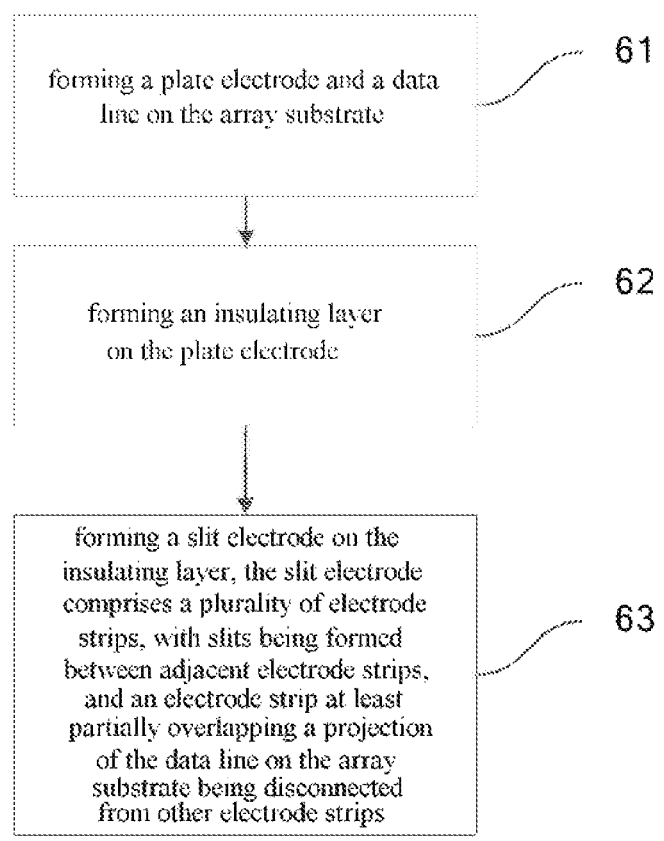
FIG. 6 is a flow chart of a method for manufacturing an array substrate according to an embodiment of the present application.

FIG. 6 is a flow chart of a method for manufacturing an array substrate according to an embodiment of the present application. In step 61, a plate electrode and a data line is formed on an array substrate. In step 62, an insulating layer is formed on the plate electrode. In step 63, a slit electrode is formed on the insulating layer, said slit electrode comprising a plurality of electrode strips, with slits being formed between adjacent electrode strips, and an electrode strip at least partially overlapping a projection of the data line on the array substrate being disconnected from other electrode strips.

By forming slits at two ends of the electrode strip that at least partially overlaps the projection of the data line on the array substrate, said electrode strip can be disconnected from other electrode strips.

The array substrate according to the present application can be applied to various display devices including (but are not limited to) a thin film transistor liquid crystal display (TFT-LCD). The display device can be any product or component having a display function, such as a mobile phone, a tablet PC, a television, a monitor, a laptop, a digital photo frame, and a navigator.

Of course, the display device provided in the present application may also include other conventional structures, such as a display driving unit and the like, which will not be elaborated herein.

It shall be understood that the above embodiments are merely exemplary embodiments adopted for illustrating the principle of the present application, while the present application is not limited to said embodiments. Those skilled in the art can make various modifications and improvements without departing from the spirit and substance of the present application, so such modifications and improvements also fall into the protection scope of the present application.

The invention claimed is:

1. An array substrate, comprising: a plurality of gate lines, a plurality of data lines and a plurality of pixel units arranged in an array, wherein each pixel unit comprises a plate electrode, a slit electrode, and an insulating layer disposed between the plate electrode and the slit electrode, wherein
    the slit electrode includes a plurality of electrode strips, with slits being formed between adjacent electrode strips, and an electrode strip that at least partially overlaps a projection of the data line on the array substrate being disconnected from other electrode strips, and
    wherein the electrode strip that at least partially overlaps the projection of the data line on the array substrate is disconnected from other electrode strips of the slit electrode to form a strip-shape island insulated with other electrode strips of the slit electrode by forming slits at two ends and two sides of said electrode strip.

2. The array substrate according to claim 1, wherein the electrode strip that at least partially overlaps the projection of the data line on the array substrate overlays said data line.

3. The array substrate according to claim 1, wherein the plate electrode and the data line are arranged in the same layer.

4. The array substrate according to claim 1, wherein the plate electrode is a pixel electrode and the slit electrode is a common electrode.

5. The array substrate according to claim 4, wherein the electrode strip that at least partially overlaps the projection of the data line on the array substrate is disconnected from the common electrode.

6. The array substrate according to claim 1, wherein the slit electrode is made of indium tin oxide.

7. The array substrate according to claim 1, wherein the plate electrode is made of indium tin oxide.

8. A display device, comprising an array substrate according to claim 1.

9. A method of manufacturing an array substrate, comprising:
    forming a plate electrode and a data line on the array substrate;
    forming an insulating layer on the plate electrode; and
    forming a slit electrode on the insulating layer;
    wherein the slit electrode comprises a plurality of electrode strips, with slits being formed between adjacent electrode strips, and an electrode strip at least partially overlapping a projection of the data line on the array substrate being disconnected from other electrode strips, and
    wherein the electrode strip that at least partially overlaps the projection of the data line on the array substrate is disconnected from other electrode strips of the slit electrode to form a strip-shape island insulated with other electrode strips of the slit electrode by forming slits at two ends and two sides of said electrode strip.

10. The display device according to claim 8, wherein the electrode strip that at least partially overlaps the projection of the data line on the array substrate overlays said data line.

11. The display device according to claim 8, wherein the plate electrode and the data line are arranged in the same layer.

12. The display device according to claim 8, wherein the plate electrode is a pixel electrode and the slit electrode is a common electrode.

13. The display device according to claim 12, wherein the electrode strip that at least partially overlaps the projection of the data line on the array substrate is disconnected from the common electrode.

14. The display device according to claim 8, wherein the slit electrode is made of indium tin oxide.

15. The display device according to claim 8, wherein the plate electrode is made of indium tin oxide.

* * * * *